United States Patent
Guo et al.

(10) Patent No.: US 9,903,884 B2
(45) Date of Patent: Feb. 27, 2018

(54) PARALLEL PLATE CAPACITOR AND ACCELERATION SENSOR COMPRISING SAME

(71) Applicant: CSMC TECHNOLOGIES FAB1 CO., LTD., Jiangsu (CN)

(72) Inventors: Meihan Guo, Jiangsu (CN); Xinwei Zhang, Jiangsu (CN); Changfeng Xia, Jiangsu (CN); Wei Su, Jiangsu (CN)

(73) Assignee: CSMC Technologies FAB1 Co. Ltd., Jiangsu (CN)

( * ) Notice: Subject to any disclaimer, the term of this patent is extended or adjusted under 35 U.S.C. 154(b) by 271 days.

(21) Appl. No.: 14/435,925

(22) PCT Filed: Aug. 30, 2013

(86) PCT No.: PCT/CN2013/082626
§ 371 (c)(1),
(2) Date: Apr. 15, 2015

(87) PCT Pub. No.: WO2014/059832
PCT Pub. Date: Apr. 24, 2014

(65) Prior Publication Data
US 2015/0233965 A1    Aug. 20, 2015

(30) Foreign Application Priority Data

Oct. 16, 2012    (CN) ............ 2012 1 0391609

(51) Int. Cl.
*G01P 15/125* (2006.01)
*H02N 1/08* (2006.01)
*B81B 7/02* (2006.01)

(52) U.S. Cl.
CPC .............. *G01P 15/125* (2013.01); *B81B 7/02* (2013.01); *H02N 1/08* (2013.01)

(58) Field of Classification Search
CPC ............ B81B 7/02; G01P 15/125; H02N 1/08
See application file for complete search history.

(56) References Cited

U.S. PATENT DOCUMENTS

| 6,230,563 B1 | 5/2001 | Clark |
| 2002/0134154 A1* | 9/2002 | Hsu ................ G01C 19/5719 73/504.04 |

(Continued)

FOREIGN PATENT DOCUMENTS

| CN | 1529172 A | 9/2004 |
| CN | 1752757 A | 3/2006 |

(Continued)

OTHER PUBLICATIONS

International Search Report dated Nov. 28, 2013, cited by State Intellectual Propoerty Office of the P.R. China Patent Office, and which was cited in the international patent application PCT/CN2013/082626, filed Aug. 30, 2013, to which this application claims priority (3 pages).

(Continued)

*Primary Examiner* — Francis Gray
(74) *Attorney, Agent, or Firm* — Mark Malek; Paul Ditmyer; Widerman Malek, PL

(57) ABSTRACT

A parallel plate capacitor includes a first polar plate (10), and a second polar plate disposed opposite to the first polar plate (10). The parallel plate capacitor further includes at least a pair of sensitive units disposed on a substrate forming the first polar plate (10); the sensitive units includes sensitive elements (21a, 21b, 22a, 22b) and element connecting arms (23a, 23b, 24a, 24b) connecting the sensitive elements (21a, 21b, 22a, 22b) to the first polar plate (10). The parallel plate capacitor further includes anchoring bases (30, 31, 32, 33) disposed on a substrate where the second polar plate is located; the anchoring bases (30, 31, 32, 33) are connected to the element connecting arms (23a, 23b, 24a, 24b) via (Continued)

cantilever beams (30a, 30b, 31a, 31b, 32a, 32b, 33a, 33b); each element connecting arm (23a, 23b, 24a, 24b) is connected to at least two anchoring bases (30, 31, 32, 33), which are symmetric with respect to the element connecting arm. The parallel plate capacitor is more likely to be influenced by an external factor, thus being more likely to experience capacitance change. An acceleration sensor including the parallel plate capacitor is also provided.

8 Claims, 3 Drawing Sheets

(56) References Cited

U.S. PATENT DOCUMENTS

| | | | |
|---|---|---|---|
| 2003/0205087 A1 | 11/2003 | Challoner | |
| 2004/0035204 A1* | 2/2004 | Durante | G01C 19/5719 73/504.04 |
| 2004/0173023 A1* | 9/2004 | Yan | G01C 19/5719 73/504.12 |
| 2005/0132803 A1 | 6/2005 | Baldwin et al. | |
| 2007/0089519 A1 | 4/2007 | Hao et al. | |
| 2011/0152695 A1* | 6/2011 | Granqvist | A61B 5/0006 600/481 |
| 2014/0026658 A1* | 1/2014 | Zhang | B81B 5/00 73/504.12 |
| 2014/0165724 A1* | 6/2014 | Krylov | G01P 15/097 73/514.15 |
| 2014/0252358 A1* | 9/2014 | Chu | B81B 3/0059 257/51 |

FOREIGN PATENT DOCUMENTS

| | | | | |
|---|---|---|---|---|
| CN | 1844933 A | 10/2006 | | |
| CN | 1844934 A | 10/2006 | | |
| CN | 1847857 A | 10/2006 | | |
| CN | 1959417 A | 5/2007 | | |
| CN | 102608356 A | 7/2012 | | |
| GB | 0720412 | * | 11/2007 | G01C 19/56 |
| WO | WO 01/89986 A1 | 11/2001 | | |

OTHER PUBLICATIONS

European Search Report dated Feb. 22, 2016, cited by European Patent Office, in the European Patent Application EP 13 84 7107 (7 pages).

* cited by examiner

PARALLEL PLATE CAPACITOR AND ACCELERATION SENSOR COMPRISING SAME

CROSS REFERENCE TO RELATED APPLICATIONS

This is a national stage application under 35 U.S.C. § 371 of PCT patent application PCT/CN2013/082626, filed on Aug. 30, 2013, which claims the benefit of CN 2012-10391609.7, filed Oct. 16, 2012, each of which is hereby incorporated by reference in its entirety.

FIELD OF THE INVENTION

The present disclosure relates to a field of capacitor, and more particularly relates to a parallel plate capacitor.

BACKGROUND OF THE INVENTION

Micro-Electro-Mechanical System (MEMS) is a recently developed interdisciplinary cutting-edge high-tech field. MEMS applies micro silicon mechanical processing technology developed on semiconductor technology, mainly uses silicon as material, and implements sensing and controlling external information by manufacturing suspended movable three-dimensional structures of micron dimension size on a silicon chip. MEMS acceleration sensor is a sensor based on such technology.

It is well known that a basic structure of a capacitive MEMS acceleration sensor is a capacitor consists of a mass and fixed electrodes. When a displacement of the mass is produced by the acceleration, an overlapping area or a distance between the electrodes of the capacitor is changed, in this case, a measurement of the acceleration can be implemented by measuring the capacitance change of the capacitor. As one of the MEMS acceleration sensors, an acceleration sensor formed by a parallel plate capacitor is widely used because of its simple processing, less influence by parasitic capacitance and edge effect, and low requirement of processing circuit.

However, recently, due to a relatively small change range of the parallel plate capacitor in such acceleration sensor, the sensitivity of the sensor is relatively low.

SUMMARY OF THE INVENTION

Accordingly, the disclosure provides a parallel plate capacitor. The capacitor includes a first polar plate, and a second polar plate disposed opposite to the first polar plate. The parallel plate capacitor further includes: at least a pair of sensitive units disposed on a substrate forming the first polar plate, the sensitive unit includes a sensitive element and an element connecting arm connecting the sensitive element to the first polar plate; an anchoring base disposed on a substrate where the second polar plate is located, the anchoring base is connected to the element connecting arm via a cantilever beam; each element connecting arm is connected to at least two anchoring bases being symmetric with respect to the element connecting arm.

Preferably, in the parallel plate capacitor, each sensitive element is a mass, each element connecting arm and each cantilever beam are both made of silicon, and each element connecting arm is thicker than each cantilever beam.

The disclosure further provides a parallel plate capacitor, which includes a first polar plate, and a second polar plate disposed opposite to the first polar plate. The parallel plate capacitor further includes: at least one sensitive unit disposed on a substrate forming the first polar plate, the sensitive unit is surrounded by the first polar plate, and the sensitive unit includes a sensitive element and an element connecting arm connecting the sensitive element to the first polar plate; an anchoring base disposed on a substrate where the second polar plate is located; the anchoring base is connected to the element connecting arm via a cantilever beam; each element connecting arm is connected to at least two anchoring bases being symmetric with respect to the element connecting arm.

The present parallel plate capacitor can amplify a strain of the sensitive element by a leverage effect formed by the element connecting arm, the sensitive element and the first polar plate of the capacitor, so that the capacitor can be more susceptible to force and generates capacitance change.

DETAILED DESCRIPTION OF THE EMBODIMENTS

Figure 1:
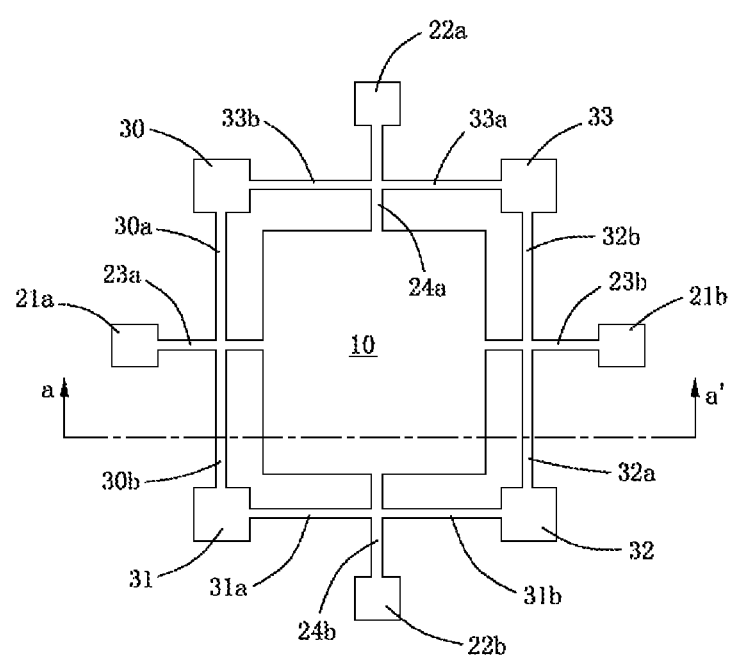
FIG. 1 is a schematic top plan view of a parallel plate capacitor 1 in accordance with an embodiment of the present disclosure.

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art. Elements that are identified using the same or similar reference characters refer to the same or similar elements.

FIG. 1 is a schematic top plan view of a parallel plate capacitor in accordance with an embodiment. The parallel plate capacitor includes a first polar plate 10 and a second polar plate (not shown), a first pair of sensitive elements 21a, 21b, and a second pair of sensitive elements 22a, 22b, element connecting arms 23a, 23b configured to connect the first pair of sensitive elements 21a, 21b to the first polar plate 10, element connecting arms 24a, 24b configured to connect the second pair of sensitive elements 22a, 22b to the first polar plate 10, anchoring bases 30, 31, 32 and 33 disposed on the second polar plate, a cantilever beam 30a connecting the anchoring base 30 to the element connecting arm 23a, a cantilever beam 30b connecting the anchoring base 31 to the element connecting arm 23a, a cantilever beam 31 a connecting the anchoring base 32 to the element connecting arm 24b, a cantilever beam 31b connecting the anchoring base 32 to the element connecting arm 24b, a cantilever beam 32a connecting the anchoring base 32 to the element connecting arm 23b, a cantilever beam 32b connecting the anchoring base 33 to the element connecting arm 23b, a cantilever beam 33a connecting the anchoring base 33 to the element connecting arm 24a, and a cantilever beam 33b connecting the anchoring base 30 to the element connecting arm 24a. Preferably, each cantilever beam is perpendicular to the element connecting arm connected to it.

The sensitive elements and the element connecting arms compose the sensitive units; all of them are disposed on a substrate where the first polar plate is located. The sensitive elements can be, for example, masses. In the illustrated embodiment, the element connecting arms and the cantilever beams are all made of silicon, for example, the element connecting arms and the cantilever beams are obtained by etching the substrate. It is to be understood that, the mass has relatively large weight. Each cantilever beam is also formed of silicon on the substrate where the first polar plate is located, and each cantilever beam is thinner than the element connecting arm. The anchoring bases disposed on the second polar plate extend from the second polar plate to the first polar plate, and are fixedly connected to corresponding element connecting arms.

According to the present disclosure, the two sensitive elements of each pair of sensitive elements in each sensitive unit are disposed symmetrically at opposite sides of the conductive portion. In the embodiment shown is FIG. 1, two pairs of sensitive elements are disposed. The first pair of sensitive elements 21a, 21b are respectively disposed on two sides of the first polar plate 10, in a view facing to the diagram during normal reading, the sensitive element 21a is disposed on a left side of the first polar plate 10, and the sensitive element 21b is correspondingly disposed on a right side of the first polar plate 10; the element connecting arm 23a and the element connecting arm 23b have the same length. The second pair of sensitive elements 22a, 22b are respectively disposed on another two sides of the first polar plate 10, in a view facing to the diagram during normal reading, the sensitive element 22a is disposed on an upper side of the first polar plate 10, and the sensitive element 22b is correspondingly disposed on a lower side of the first polar plate 10; the element connecting arm 24a and the element connecting arm 24b have the same length.

Furthermore, in the above described embodiment, each sensitive element is an identical mass. Each mass is connected to the first polar plate 10 via a corresponding element connecting arm, thereby forming a lever. In other words, the element connecting arm 23a acts as the lever, and the sensitive element 21a is located on an end and the first polar plate 10 is located on the other end thereof; the same cases apply to other sensitive elements and element connecting arms and will not be described here.

Figure 2:
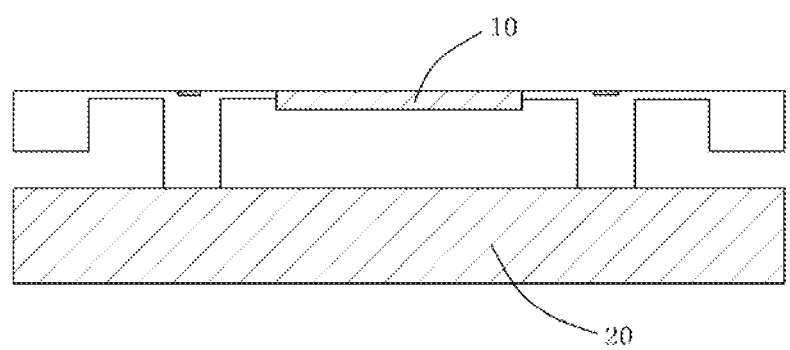
FIG. 2 is a schematic sectional view taken from line a-a' of the parallel plate capacitor in FIG. 1.

FIG. 2 is a schematic sectional view taken from line a-a' of the parallel plate capacitor in FIG. 1. As shown in FIG. 2, anchoring bases 30 and 33 (the anchoring bases 31 and 32 are not shown because FIG. 2 is a sectional view taken from line a-a') are disposed between the first polar plate 10 and the second polar plate 20 to support the levers (i.e. the element connecting arms) 23a and 23b. The mass 21a is connected to the first polar plate 10 via the lever 23a, and the mass 21b is connected to the second polar plate 10 via the lever 23b.

When the parallel plate capacitor 1 is used as a sensing component of an acceleration sensor, if the acceleration sensor is subjected to acceleration in a vertical direction, then each sensitive element (such as each mass) will sense the acceleration, and apply force in a direction opposite to the acceleration to the corresponding element connecting arm (i.e. the lever) under the inertia effect. Since, according to the present disclosure, the thickness of the cantilever beam is less than that of the element connecting arm, such that after the cantilever beam is acted upon by the force transmitted from the element connecting arm, the deformation of the cantilever beam is relatively great, which impels a greater displacement of the first polar plate 10, i.e. causing a greater displacement of the first polar plate in the same direction with the acceleration, and, correspondingly, a capacitance change between the first polar plate and the second polar plate is relatively great. Because of the lever structure formed by the sensitive element, the element connecting arm and the first polar plate, a greater displacement is obtained by the two polar plates under the same acceleration, thus causing a greater capacitance change, and the acceleration sensor containing the parallel plate capacitor is more sensitive.

The above embodiments show that the parallel plate capacitor includes two pairs of sensitive units, but the present disclosure is not limited to this. In practical applications, more sensitive units or only one sensitive unit can be configured according to requirements.

Figure 3:
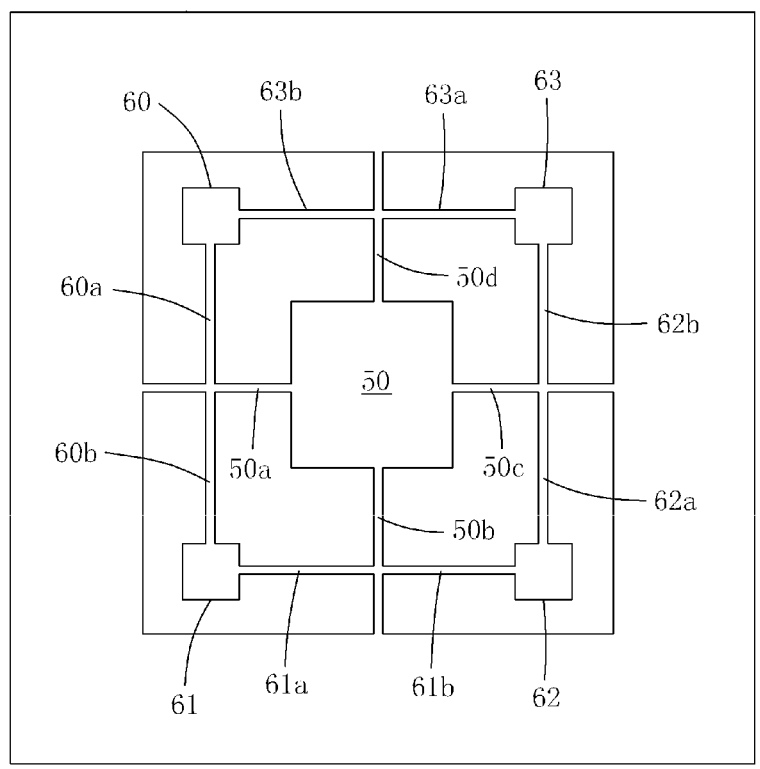
FIG. 3 is a schematic top plan view of a parallel plate capacitor 2 in accordance with another embodiment of the present disclosure.

FIG. 3 is a schematic top plan view of a parallel plate capacitor in accordance with another embodiment of the present disclosure. Different from the parallel plate capacitor shown in FIG. 1, in the illustrated embodiment, a lever formed by a sensitive element and a element connecting arm, and a cantilever beam connected between an anchoring base and the element connecting arm are formed on an inner side of a first polar plate, i.e. in the illustrated embodiment, the sensitive unit is surrounded by the first polar plate, and the sensitive element includes only one sensitive unit.

As shown in FIG. 3, the capacitor includes a first polar plate 40 and a second polar plate (not shown), a sensitive element 50, element connecting arms 50a, 50b, 50c, and 50d configured to connect the sensitive element 50 to the first polar plate 40, anchoring bases 60, 61, 62, and 63 disposed on the second polar plate, a cantilever beam 60a connecting the anchoring base 60 to the element connecting arm 50a, a cantilever beam 60b connecting the anchoring base 61 to the element connecting arm 50a, a cantilever beam 61a connecting the anchoring base 61 to the element connecting arm 50b, a cantilever beam 61b connecting the anchoring base 62 to the element connecting arm 50b, a cantilever beam 62a connecting the anchoring base 62 to the element connecting arm 50c, a cantilever beam 62b connecting the anchoring base 63 to the element connecting arm 50c, a cantilever beam 63a connecting the anchoring base 63 to the element connecting arm 50d, a cantilever beam 63b connecting the anchoring base 60 to the element connecting arm 50d. Preferably, each element connecting arm is perpendicular to the cantilever beam connected to it.

The sensitive elements and the element connecting arms compose a sensitive unit, and all of them are disposed on a silicon substrate where the first polar plate is located. The sensitive element can be, for example, a mass. The sensitive elements and the element connecting arms are all made of silicon material in the illustrated embodiment, the element connecting arms and the cantilever beams are obtained by etching on the substrate. It is to be understood that, the mass has relatively large weight. Each cantilever beam is also formed of silicon on the substrate where the first polar plate is located, and each cantilever beam is thinner than the element connecting arm. The anchoring bases disposed on the second polar plate extend from the second polar plate to the first polar plate, and are fixedly connected to corresponding element connecting arms.

In the embodiment shown in FIG. 3, preferably, element connecting arms being symmetric with respect to a sensitive element have the same length, and more preferably, each element connecting arm has a same length. In the illustrated embodiment, the sensitive element is an identical mass, which is connected to the first polar plate 40 via the element connecting arm, and thereby forming a lever based on the element connecting arm. In other words, the element connecting arm 50a acts as the lever, and the sensitive element 50 is located on an end and the first polar plate 40 is located on the other end thereof; the same cases apply to other sensitive elements and element connecting arms and will not be described here.

When the parallel plate capacitor 2 is used as a sensing component of an acceleration sensor, if the acceleration sensor is subjected to acceleration in a vertical direction, then each sensitive element (such as each mass) will sense the acceleration, and apply force in a direction opposite to the acceleration to the corresponding element connecting arm (i.e. the lever) under the inertia effect. In this case, after the thinner cantilever beam is acted upon by the force transmitted from the element connecting arm, the deformation of the cantilever beam is relatively great, which impels a greater displacement of the first polar plate 10, i.e. causing a greater displacement of the first polar plate in the same direction with the acceleration, and, correspondingly, a capacitance change between the first polar plate and the second polar plate is relatively great. Because of the lever structure formed by the sensitive element, the element connecting arm and the first polar plate, a greater displacement is obtained by the two polar plates under the same acceleration, thus causing a greater capacitance change, and the acceleration sensor containing the parallel plate capacitor is more sensitive.

Although the above described embodiments of the present disclosure are illustrated by using silicon material as the substrate, in practical applications, substrates of other material, such as germanium silicide, can also be applied.

In addition, in order to better achieve a function of the lever, each point where the element connecting arm connects to the cantilever beam is closer to the mass.

What is claimed is:

1. A parallel plate capacitor, comprising a first polar plate, and a second polar plate disposed opposite to the first polar plate, wherein the parallel plate capacitor comprises:
    at least a pair of sensitive units disposed on a first substrate forming the first polar plate, wherein each sensitive unit comprises a sensitive element and an element connecting arm connecting the sensitive element to the first polar plate;
    anchoring bases disposed on a second substrate where the second polar plate is located, wherein each anchoring base is connected to a respective element connecting arm via a cantilever beam;
    wherein each element connecting arm is connected to at least two anchoring bases, which are symmetric with respect to the element connecting arm.

2. The parallel plate capacitor according to claim 1, wherein the sensitive element is a mass, the element connecting arm and the cantilever beam are both made of silicon, and the element connecting arm is thicker than the cantilever beam.

3. A parallel plate capacitor, comprising a first polar plate, and a second polar plate disposed opposite to the first polar plate, wherein the parallel plate capacitor comprises:
    at least one sensitive unit disposed on a substrate forming the first polar plate, wherein the sensitive unit is surrounded by the first polar plate, and the sensitive unit comprises a sensitive element and an element connecting arm connecting the sensitive element to the first polar plate;
    anchoring bases disposed on a second substrate where the second polar plate is located, wherein each anchoring base is connected to a respective element connecting arm via a cantilever beam;
    wherein each element connecting arm is connected to at least two anchoring bases, which are symmetric with respect to the element connecting arm.

4. The parallel plate capacitor according to claim 3, wherein the sensitive element is a mass, the element connecting arm and the cantilever beam are both made of silicon, and the element connecting arm is thicker than the cantilever beam.

5. An acceleration sensor, comprising a parallel plate capacitor, wherein the parallel plate capacitor comprises a first polar plate, and a second polar plate disposed opposite to the first polar plate, the parallel plate capacitor further comprises:
    at least a pair of sensitive units disposed on a substrate forming the first polar plate, wherein each sensitive unit comprises a sensitive element and an element connecting arm connecting the sensitive element to the first polar plate;
    anchoring bases disposed on a second substrate where the second polar plate is located, wherein each anchoring base is connected to a respective element connecting arm via a cantilever beam;
    wherein each element connecting arm is connected to at least two anchoring bases, which are symmetric with respect to the element connecting arm.

6. The acceleration sensor according to claim 5, wherein the sensitive element is a mass, the element connecting arm and the cantilever beam are both made of silicon, and the element connecting arm is thicker than the cantilever beam.

7. An acceleration sensor, comprising a parallel plate capacitor, wherein the parallel plate capacitor comprises a first polar plate, and a second polar plate disposed opposite to the first polar plate, the parallel plate capacitor further comprises:
    at least one sensitive unit disposed on a first substrate forming the first polar plate, wherein the sensitive unit is surrounded by the first polar plate, and the sensitive unit comprises a sensitive element and an element connecting arm connecting the sensitive element to the first polar plate;
    anchoring bases disposed on a second substrate where the second polar plate is located, wherein each anchoring base is connected to a respective element connecting arm via a cantilever beam;
    wherein each element connecting arm is connected to at least two anchoring bases, which are symmetric with respect to the element connecting arm.

8. The acceleration sensor according to claim 7, wherein the sensitive element is a mass, the element connecting arm and the cantilever beam are both made of silicon, and the element connecting arm is thicker than the cantilever beam.

* * * * *